United States Patent
Xu et al.

(10) Patent No.: US 10,916,613 B1
(45) Date of Patent: Feb. 9, 2021

(54) ARRAY SUBSTRATE AND OLED DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Pinquan Xu, Hubei (CN); Wei Wang, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 0 days.

(21) Appl. No.: 16/619,480

(22) PCT Filed: Sep. 2, 2019

(86) PCT No.: PCT/CN2019/103908
§ 371 (c)(1),
(2) Date: Dec. 5, 2019

(30) Foreign Application Priority Data

Jul. 26, 2019  (CN) .......................... 2019 1 0680032

(51) Int. Cl.
*H01L 29/08* (2006.01)
*H01L 27/32* (2006.01)
*H01L 27/12* (2006.01)

(52) U.S. Cl.
CPC ...... *H01L 27/3265* (2013.01); *H01L 27/3258* (2013.01); *H01L 27/3262* (2013.01); *H01L 27/3276* (2013.01); *H01L 27/1255* (2013.01)

(58) Field of Classification Search
CPC ............. H01L 27/3265; H01L 27/3258; H01L 27/3262; H01L 27/3276; H01L 27/1225
See application file for complete search history.

(56) References Cited

U.S. PATENT DOCUMENTS

| 2005/0236629 | A1 | 10/2005 | Lee et al. | |
| 2015/0123111 | A1* | 5/2015 | Tseng | H01L 29/42384 257/43 |
| 2017/0194405 | A1* | 7/2017 | Tang | H01L 27/1251 |
| 2019/0006448 | A1* | 1/2019 | Zhou | G09G 3/3233 |
| 2019/0280072 | A1* | 9/2019 | Jeong | H01L 27/1255 |

FOREIGN PATENT DOCUMENTS

| CN | 109860259 A | 6/2019 |
| CN | 109887956 A | 6/2019 |
| CN | 109887973 A | 6/2019 |

* cited by examiner

*Primary Examiner* — Phuc T Dang
(74) *Attorney, Agent, or Firm* — Mark M. Friedman

(57) ABSTRACT

An array substrate and an OLED display device are provided. A trace system of the array substrate is designed in a structure with three layers of metal. By providing one layer of inorganic insulation film and one layer of organic insulation film between two layers of metal, a coupling effect between two layers of trace can be reduced. By exposing all or part of an organic insulation film in a region, which will form a second electrode plate of a storage capacitor, a storage capacitor with larger capacitance can be formed. By forming a third metal layer as a mesh structure, it is possible to reduce IR drop without increasing mask and improve display uniformity of the display device.

20 Claims, 2 Drawing Sheets

ARRAY SUBSTRATE AND OLED DISPLAY DEVICE

FIELD OF INVENTION

The present invention relates to the field of display technologies, and more particularly, to an array substrate and an OLED display device.

BACKGROUND OF INVENTION

In recent years, due to the development of organic light emitting diode (OLED) display technology, curved displays and flexible displays have quickly entered into the market, and technical updates in related fields are also changing rapidly. OLED refers to a diode that emits light by carrier injection and recombination under the electric field driven by an organic semiconductor material and a luminescent material. The OLED display device has wider application range due to its advantages of lightweight, self-illumination, wide viewing angles, low driving voltage, high luminous efficiency, low power consumption, and fast response time.

OLED is a current-driven device that emits light when a current flows through it, and the luminance of the light is determined by the current flowing through the OLED. Most existing integrated circuits (ICs) only transmit voltage signals, so the pixel driving circuit of the OLED needs to convert the voltage signal into a current signal. In existing technology, the pixel driving circuit of the OLED usually has a circuit with 7 transistors and 1 capacitor (7T1C, that is, a structure with seven thin film transistors and one storage capacitor) to convert a voltage into a current, and to control a pixel current by 7T1C circuit.

Referring to FIG. 1, FIG. 1 is a schematic diagram of a layered structure of an existing array substrate. The array substrate includes a substrate base 111, a barrier layer (MIB) 112, a buffer layer (Buffer) 113, an active layer (Act) 114, a first gate insulation layer (GI1) 115, a first gate layer (GE1) 116, a second gate insulation layer (GI2) 117, a second gate layer (GE2) 118, an interlayer insulation layer (ILD) 119, a first source/drain layer (SD1) 120, a passivation layer (PV) 121, a first planarization layer (PLN1) 122, a second source/drain layer (SD2) 123, and a second planarization layer (PLN2) 124. A display panel using the array substrate further includes an anode (ANO) 125 disposed on the second planarization layer 124, a pixel defined layer (PDL) 126, and a photo spacer (PS) 127.

As shown in FIG. 1, in the existing array substrate, the active layer 114, the first gate layer 116, and the first source/drain electrode 120 are used to form the thin film transistor (TFT) of the 7T1C circuit. The first gate layer 116 is used as the lower plate of the storage capacitor, the second gate layer 118 is used as the upper plate of the storage capacitor, and the second gate insulation layer 117 disposed between the first gate layer 116 and the second gate layer 118 is used as the dielectric layer; thereby, the storage capacitor of the 7T1C circuit is formed to perform the driving operation of the drive thin film transistor (Drive TFT). One layer of inorganic insulation film deposited on the second gate layer 118 is used as the interlayer insulation layer 119, and then the first source/drain layer 120 is deposited and is patterned to form the source/drain electrode and the data line (Data line). The first planarization layer 122 is coated on the first source/drain layer 120, and then the second source/drain layer 123 is deposited and is patterned to form the power line (Power line). The second planarization layer 124 is coated on the second source/drain layer 123, and then an anode metal (PE) is deposited and patterned to form the anode 125.

IR-drop in the active area (AA) of the existing array substrate during displaying causes an issue of uneven display of the screen, and the process thereof may have a risk. Furthermore, coupling capacitance exists between the data line and the power line in the existing array substrate, and a thickness of the dielectric layer between two gate layers is limited; thereby, a storage capacitor with larger capacitance cannot be formed.

Therefore, it is necessary to provide a flexible display device to solve the problems of the prior art.

SUMMARY OF INVENTION

The object of the present application is to provide an array substrate and an OLED display device, which can reduce IR drop, improve the display uniformity of the display device, reduce the coupling storage capacitance between the traces, and a storage capacitor with larger capacitance can be formed.

In order to achieve the aforementioned object, the present application provides an array substrate including a plurality of sub-pixels, wherein each of the sub-pixels includes a drive thin film transistor and a storage capacitor, and adjacent two columns of the sub-pixels are arranged in a mirror symmetrical structure, the array substrate further including: a first metal layer forming a gate electrode and a scan line of the drive thin film transistor; a second metal layer forming a source/drain electrode, a data line, a reset signal line of the drive thin film transistor, and a first electrode plate of the storage capacitor, wherein one layer of inorganic insulation film and one layer of organic insulation film are provided between the first metal layer and the second metal layer; and a third metal layer forming a power line and a second electrode plate of the storage capacitor, wherein one layer of inorganic insulation film and one layer of organic insulation film are provided between the second metal layer and the third metal layer.

In order to achieve the aforementioned object, the present application further provides an array substrate including a plurality of sub-pixels, wherein each of the sub-pixels includes a drive thin film transistor and a storage capacitor, the array substrate further including: a first metal layer forming a gate electrode and a scan line of the drive thin film transistor; a second metal layer forming a source/drain electrode, a data line, a reset signal line of the drive thin film transistor, and a first electrode plate of the storage capacitor; and a third metal layer forming a power line and a second electrode plate of the storage capacitor.

In order to achieve the aforementioned object, the present application further provides an OLED display device, wherein the OLED display device includes an OLED display panel including an array substrate, the array substrate including a plurality of sub-pixels, each of the sub-pixels including a drive thin film transistor and a storage capacitor, and the array substrate further including: a first metal layer forming a gate electrode and a scan line of the drive thin film transistor; a second metal layer forming a source/drain electrode, a data line, a reset signal line of the drive thin film transistor, and a first electrode plate of the storage capacitor; and a third metal layer forming a power line and a second electrode plate of the storage capacitor.

The beneficial effect: the trace system of the array substrate is designed in a structure with three layers of metal, which facilitates to obtain a circuit designed with a larger pixel per inch (PPI). By providing one layer of inorganic insulation film and one layer of organic insulation film between the two layers of metal, the coupling effect between the two layers of trace can be reduced. By exposing all or part of the organic insulation film in a region, which will form the second electrode plate of the storage capacitor, a storage capacitor with larger capacitance can be formed. By forming the third metal layer as a mesh structure, it is possible to reduce the IR drop without increasing the mask and improve the display uniformity of the display device. In addition, the present application is arranged in a mirror symmetrical structure, and the number of power lines, reset signal lines, and via holes can be reduced by about half, thereby providing space for pixels to realize a display device with high PPI.

DESCRIPTION OF DRAWINGS

In order to more clearly illustrate the technical solutions in the embodiments or the prior art, the following drawings, which are intended to be used in the description of the embodiments or the prior art, will be briefly described. It is obvious that the drawings and the following description are only some embodiments of the present invention. Those of ordinary skill in the art may, without creative efforts, derive other drawings from these drawings.

DETAILED DESCRIPTION OF PREFERRED EMBODIMENTS

Figure 1:
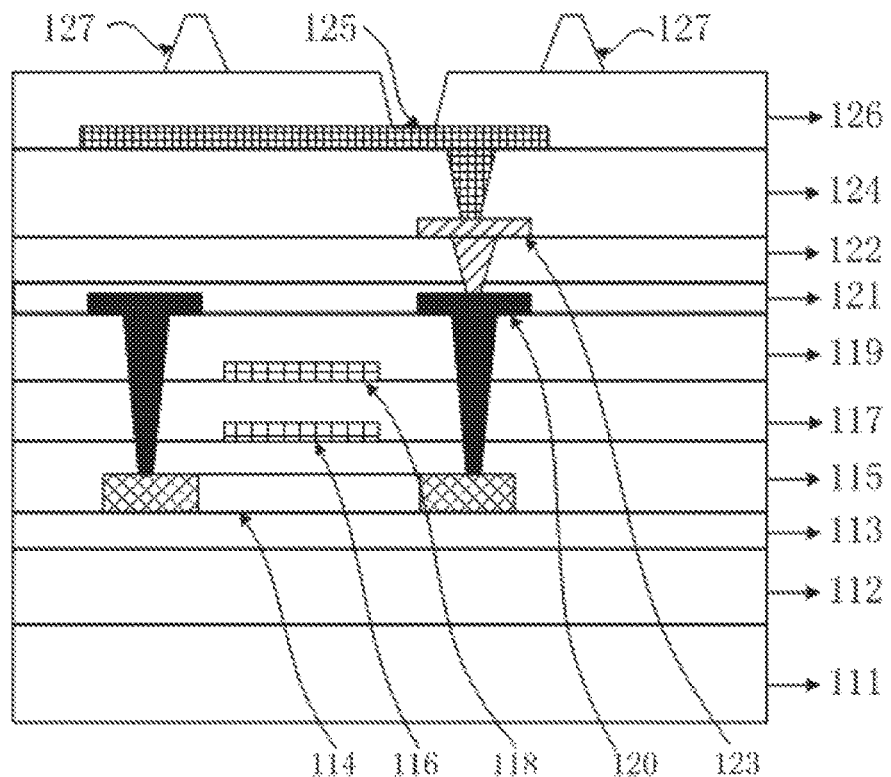
FIG. 1 is a schematic diagram of a layered structure of an existing array substrate.

In the following detailed description of the preferred embodiments, reference is made to the accompanying drawings which form a part hereof, and in which is shown by way of illustrating specific embodiments in which the invention may be practiced. In this regard, directional terminology; such as "top", "bottom", "front"; "back", "left", "right", "inside", "outside", "side", etc., is used with reference to the orientation of the figure(s) being described. As such, the directional terminology is used for purposes of illustration and is in no way limiting. Throughout this specification and in the drawings, like parts will be referred to by the same reference numerals.

An array substrate of the present application includes a plurality of sub-pixels, each of the sub-pixels includes a drive thin film transistor (Driver TFT) and a storage capacitor. The array substrate further includes a first metal layer (GE1), a second metal layer (SD1), and a third metal layer (SD2). The first metal layer (GE1) forms a gate electrode (Gate) and a scan line (Scan line) of the drive thin film transistor. The second metal layer (SD1) forms a source/drain electrode (S/D), a data line (Data line), a reset signal line (VI line, used for resetting the storage capacitor and anode) of the drive thin film transistor, and a first electrode plate of the storage capacitor. The third metal layer forms a power line and a second electrode plate of the storage capacitor. The second metal layer and the third metal layer are fabricated as the two electrode plates of the storage capacitor; and the first metal layer is only fabricated as the gate electrode and the scan line of the drive thin film transistor; therefore a circuit which is designed with a larger pixel per inch (PPI) can be realized.

Preferably, one layer of inorganic insulation film and one layer of organic insulation film are provided between the first metal layer and the second metal layer to reduce the coupling effect between the two layers of traces.

Preferably, one layer of inorganic insulation film and one layer of organic insulation film are provided between the second metal layer and the third metal layer. More preferably, only one layer of inorganic insulation film is provided between the first electrode plate and the second electrode plate of the storage capacitor, and the inorganic insulation film serves as a dielectric layer. There are two layers of the insulation layers (one layer of inorganic insulation film and one layer of organic insulation film) disposed above the data line of the second metal layer, which reduces the coupling capacitance between the data line and the power line. At a region where the second electrode plate of the storage capacitor will be formed, the organic insulation film is exposed through an exposure process, and only the inorganic insulation film is left, so that the storage capacitor with larger capacitance can be formed. A partial exposure process for the organic insulation film can also be performed through a halftone mask technology, to achieve the purposes of reducing the thickness of the dielectric layer corresponding to the region of the storage capacitor and increasing the storage capacitance, and in the meantime, ensuring that the thickness of the organic insulation film is not affected in other regions.

Preferably, the third metal layer is formed as a mesh structure, and this structure is designed to reduce the IR drop without increasing mask used in the process.

Preferably, the adjacent two columns of the sub-pixels are arranged in a mirror symmetrical structure. Preferably, the adjacent two columns of the sub-pixels share a same reset signal line and at least one first via hole, or share a same power line and at least one second via hole. Preferably, the reset signal line and the power line extend in the same direction (i.e., in parallel with each other). Compared with the existing 7T1C circuit, the number of the power lines, the reset signal lines, and the via holes can be reduced by about half in the layout of the present application, thereby providing space for pixels to realize a display device with high PPL In the present application, the trace system of the array substrate is designed in a structure with three metal layers including GE1/SD1/SD2, wherein GE1 forms a gate electrode and a scan line of the drive thin film transistor, SD1 forms a source/drain electrode, a data line, a reset signal line of the drive thin film transistor, and a first electrode plate of the storage capacitor; and SD2 forms a power line and a second electrode plate of the storage capacitor. The SD2 is formed as a mesh structure, which facilitates to obtain a circuit designed with a lager PPI, to reduce the IR drop without increasing mask used in the process, and to improve the display uniformity of the display device. The coupling effect between the two layers of metal can be reduced by providing one layer of inorganic insulation film and one layer of organic insulation film between the two layers of metal. By exposing all or part of the organic insulation film in a region, which will form the second electrode plate of the storage capacitor, a storage capacitor with larger capacitance can be formed. The present application is arranged in a mirror symmetrical structure, and the number of the power lines, the reset signal lines, and the via holes can be reduced, thereby providing space for pixels to realize a display device with high PPI.

Figure 2:
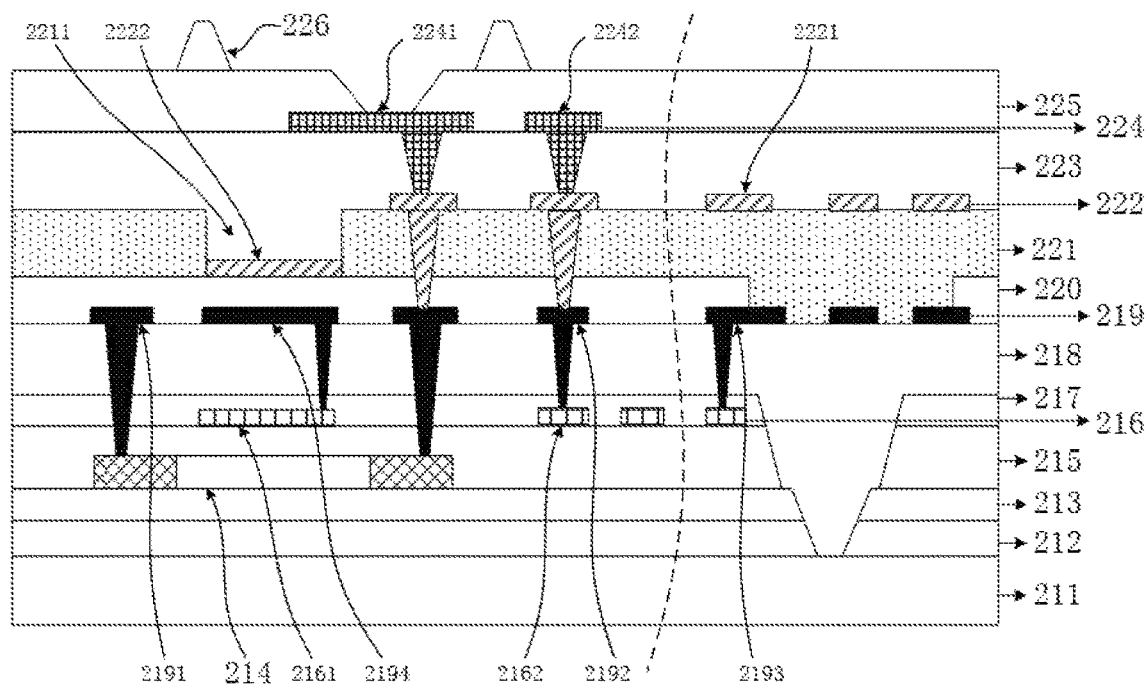
FIG. 2 is a schematic diagram of a layered structure of an array substrate, according to one embodiment of the present application.

Referring to FIG. 2, FIG. 2 is a schematic diagram of a layered structure of an array substrate, according to one embodiment of the present application. The embodiment of the present application provides an array substrate comprising a plurality of sub-pixels, each of the sub-pixels comprising a drive thin film transistor (Driver TFT) and a storage capacitor. The array substrate of the present application further includes a substrate base 211, a barrier layer (M/B) 212, a buffer layer (Buffer) 213, an active layer (active layer) 214, a first gate insulation layer (GI1) 215, a first metal layer (GE1) 216, a passivation layer (PV) 217, an organic dielectric layer (OILD) 218, a second metal layer (SD1) 219, a second gate insulation layer (GI2) 220, a first planarization layer (PLN1) 221, a third metal layer (SD2) 222, and a second planarization layer (PLN2) 223 sequentially disposed on the substrate base 211. The substrate base 211 may be a glass substrate or an organic substrate made of a colorless transparent polyimide (PI) material.

Specifically, the first metal layer 216 forms a gate electrode (Gate) 2161 and a scan line (Scan line) 2162 of the drive thin film transistor. The passivation layer 217 is an organic insulation film covering the first metal layer 216, and the organic dielectric layer 218 is an organic insulation film disposed on the passivation layer 217. That is, the first metal layer 216 and the second metal layer 219 include one layer of inorganic insulation film and one layer of organic insulation film, which can reduce the coupling effect between the two layers of traces.

Specifically, the second metal layer 219 forms a source/drain electrode (S/D) 2191 of the drive thin film transistor, a first reset signal line (VI line) 2192, a data line (Data line) 2193, and a first electrode plate 2194 of the storage capacitor. The second gate insulation layer 220 is an inorganic insulation film covering the second metal layer 219, and the first planarization layer 221 is an organic insulation film disposed on the second gate insulation layer 220.

Specifically, the third metal layer 222 forms a power line (Power (Vdd) Line or Power (VSS) Line) 2221 and a second electrode plate 2222 of the storage capacitor. The thickness of the first planarization layer 221 may be thinned by an exposure process at a region where the second electrode plate 2222 of the storage capacitor is formed, thereby thinning the thickness of the dielectric layer of the storage capacitor, forming a storage capacitor with larger capacitance, and meanwhile ensuring the thickness of the organic insulation film is not affected in other regions. The second planarization layer 223 (organic insulation film) is disposed to cover the third metal layer 222, and then an anode metal (PE) is deposited and patterned to form the anode 224. That is, one layer of inorganic insulation film (the second gate insulation layer 220) and one layer of organic insulation (the first planarization layer 221) are disposed between the data line 2193 at the second metal layer 219 and the power line 2221 at the third metal layer 222, which may reduce the coupling capacitance between the data line 2193 and the power line 2221. Preferably, the third metal layer 222 is formed as a mesh structure, and this structure is designed to reduce the IR drop without increasing mask used in the process, and improve the display uniformity of the display device.

The second metal layer 219 and the third metal layer 222 respectively form the first electrode plate, and the second electrode plate of the storage capacitor and the first metal layer 216 form the gate electrode of the drive thin film transistor and the scan line, thereby facilitating to obtain a circuit designed with a lager PPI. In addition, one layer of inorganic insulation film and one layer of organic insulation film are disposed between the two metal layers to reduce the coupling effect between the two layers of traces. The purpose of increasing the storage capacitance is achieved by reducing the thickness of the dielectric layer corresponding to the region of the storage capacitor through an exposure process.

Preferably, in the present embodiment, a trench 2211 is disposed on the first planarization layer 221 at a position corresponding to the first electrode plate 2194 of the storage capacitor, and a second electrode plate 2222 of the storage capacitor is formed in the trench 2211. That is, the dielectric layer of the storage capacitor is made by the first planarization layer 221 remaining in the trench 2211 (may also have no remaining) and the second gate insulation layer 220. The depth of the trench 2211 may be adjusted by a partial exposure process on the first planarization layer 221 through a halftone mask technology. Thus, the storage capacitance of the storage capacitor can be changed by adjusting the overlap area between the first electrode plate and the second electrode plate, and the depth of the trench 2211.

In the present embodiment, the display panel using the array substrate of the present application is an OLED display panel. The OLED display panel further includes a fourth metal layer 224 sequentially disposed on the second planarization layer 223 of the array substrate, an OLED light emitting unit (not shown), a pixel defining layer (PDL) 225, and a photoresist layer (Photo Spacer, referred to as PS) 226. Specifically, the fourth metal layer 224 forms an anode (ANO) 2241 and a second reset signal line 2242. The second gate insulation layer 220 and the first planarization layer 221 are formed with a plurality of through holes, and the same metal material as that of the third metal layer 222 is deposited in the through holes. The anode 2241 is electrically connected to the source/drain electrode 2191 of the second metal layer 219 through one through hole, and the second reset signal line 2242 is electrically connected to the first reset signal line 2192 of the second metal layer 219 through another through hole. It should be noted that the OLED display panel of the present application may further include other components, such as a cathode and a thin film encapsulation (TFE) layer, and the details are not described herein.

Figure 3:
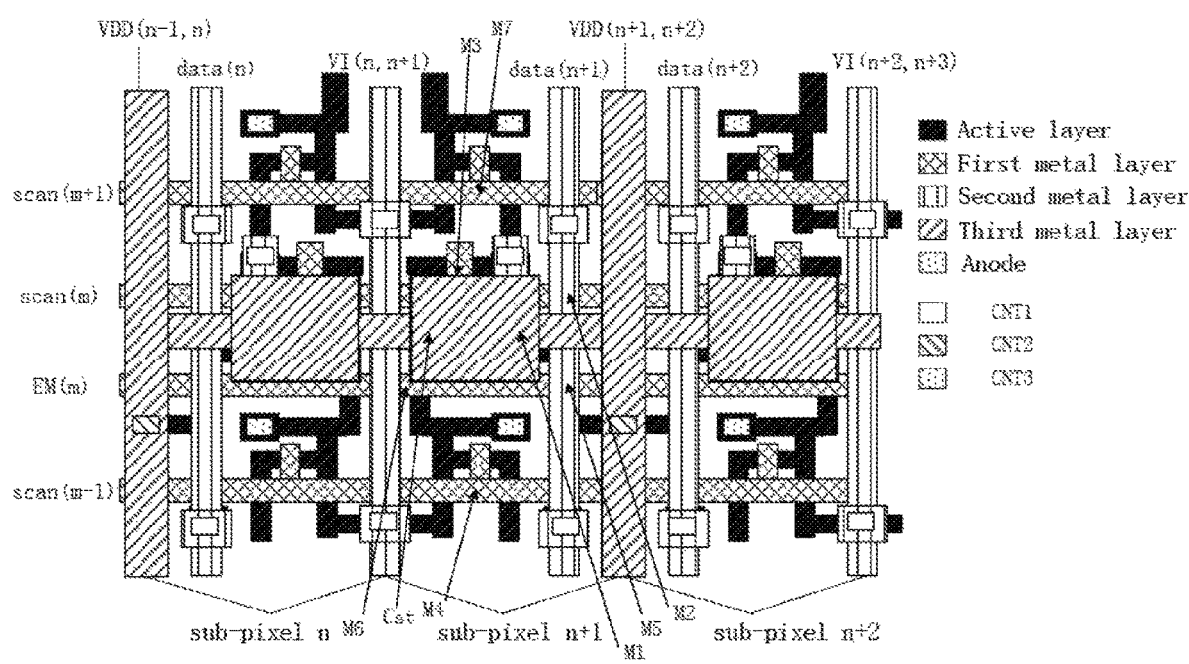
FIG. 3 is a schematic diagram of a pixel structure of an array substrate; according to one embodiment of the present application.

Referring to FIG. 3, FIG. 3 is a schematic diagram of a pixel structure of an array substrate, according to one embodiment of the present application. In FIG. 3, CNT1 is the contact hole between an active layer and a second metal layer (Poly-SD1), that is, the first via hole. CNT2 is a contact hole between a second metal layer and a third metal layer (SD1-SD2), that is, a second via hole. CNT3 is a contact hole between a third metal layer and an anode (SD2-PE), that is, a third via hole. The array substrate includes scan lines (labeled as scan), illumination signal drive lines (labeled as EM), data lines (labeled as data), pixel portion formed by the scan lines, the illumination signal drive lines and the data lines, and a plurality of sub-pixels disposed in the pixel portion. The sub-pixel has a 7T1C circuit, which includes seven thin film transistors (M1 to M7) and one storage capacitor (Cst), wherein the thin film transistor M1 is a drive thin film transistor (Driver TFT).

As shown in FIG. 3, the adjacent two columns of the sub-pixels are arranged in a mirror symmetrical structure. In FIG. 3, the 7T1C circuit in the sub-pixel n is mirror symmetrically arranged with the 7T1C circuit in the sub-pixel n+1, and the 7T1C circuit in the sub-pixel n+1 is mirror symmetrically arranged with the 7T1C circuit in the sub-pixel n+2.

As shown in FIG. 3, the adjacent two columns of the sub-pixels share the same one reset signal line (labeled as VI) and the first via hole CNT1, or share the same one power line (labeled as VDD) and the second via hole CNT2. In FIG. 3, the sub-pixel n and the sub-pixel n+1 share the reset signal line VI(n, n+1) and the first via hole CNT1, and the sub-pixel n+1 and the sub-pixel n+2 share the power line VDD(n+1, n+2) and the second via hole CNT2.

As shown in FIG. 3, the reset signal lines (VI) and the power lines (VDD) extend in the same direction (i.e., in parallel with each other).

Compared with the existing 7T1C circuit, the number of the power lines, the reset signal lines, and the via holes can be reduced by about half in the layout of the present application, thereby providing space for pixels to realize a display device with high PPI.

Based on the same application concept, the present application further provides an OLED display device, the OLED display device includes an OLED display panel, and the OLED display panel includes the above array substrate of the present application.

In the OLED display device of the present application, the trace system of the array substrate is designed in a structure with three metal layers including GE1/SD1/SD2, wherein GE1 forms a gate electrode and a scan line of the drive thin film transistor, SD1 forms a source/drain electrode, a data line, a reset signal line of the drive thin film transistor, and a first electrode plate of the storage capacitor, and SD2 forms a power line and a second electrode plate of the storage capacitor. The SD2 is formed as a mesh structure, which facilitates to obtain a circuit designed with a lager PPI, to reduce the IR drop without increasing mask used in the process, and to improve the display uniformity of the display device. The coupling effect between the two layers of metal can be reduced by providing one layer of inorganic insulation film and one layer of organic insulation film between the two layers of metal. By exposing all or part of the organic insulation film in a region which will form the second electrode plate of the storage capacitor, a storage capacitor with larger capacitance can be formed. The present application is arranged in a mirror symmetrical structure, and the number of the power lines, the reset signal lines, and the via holes can be reduced by about half, thereby providing space for pixels to realize a display device with high PPI.

What is claimed is:

1. An array substrate comprising a plurality of sub-pixels, wherein each of the sub-pixels comprises a drive thin film transistor and a storage capacitor, and adjacent two columns of the sub-pixels are arranged in a mirror symmetrical structure;

the array substrate further comprising:
a first metal layer forming a gate electrode and a scan line of the drive thin film transistor;
a second metal layer forming a source/drain electrode, a data line, a reset signal line of the drive thin film transistor, and a first electrode plate of the storage capacitor, wherein one layer of inorganic insulation film and one layer of organic insulation film are provided between the first metal layer and the second metal layer; and
a third metal layer forming a power line and a second electrode plate of the storage capacitor, wherein one layer of inorganic insulation film and one layer of organic insulation film are provided between the second metal layer and the third metal layer.

2. The array substrate according to claim 1, wherein the array substrate further comprises:
a substrate base;
a barrier layer, a buffer layer, an active layer, a first gate insulation layer, and the first metal layer sequentially disposed on the substrate base;
a passivation layer, an organic dielectric layer, and the second metal layer sequentially disposed on the first metal layer;
a second gate insulation layer, a first planarization layer, and the third metal layer sequentially disposed on the second metal layer; and
a second planarization layer covering the third metal layer.

3. The array substrate according to claim 2, wherein the first planarization layer is provided with a trench at a position corresponding to the first electrode plate of the storage capacitor, and the second electrode plate of the storage capacitor is formed in the trench.

4. The array substrate according to claim 1, wherein the adjacent two columns of the sub-pixels share a same reset signal line and at least one first via hole, or share a same power line and at least one second via hole.

5. The array substrate according to claim 1, wherein the reset signal line and the power line extend in a same direction.

6. An array substrate comprising a plurality of sub-pixels, wherein each of the sub-pixels comprises a drive thin film transistor and a storage capacitor;

the array substrate further comprising:
a first metal layer forming a gate electrode and a scan line of the drive thin film transistor;
a second metal layer forming a source/drain electrode, a data line, a reset signal line of the drive thin film transistor, and a first electrode plate of the storage capacitor; and
a third metal layer forming a power line and a second electrode plate of the storage capacitor.

7. The array substrate according to claim 6, wherein one layer of inorganic insulation film and one layer of organic insulation film are provided between the first metal layer and the second metal layer.

8. The array substrate according to claim 6, wherein one layer of inorganic insulation film and one layer of organic insulation film are provided between the second metal layer and the third metal layer, and only one layer of inorganic insulation film is provided between the first electrode plate and the second electrode plate of the storage capacitor.

9. The array substrate according to claim 6, wherein the third metal layer forms a mesh structure.

10. The array substrate according to claim 6, wherein the array substrate further comprises:
a substrate base;
a barrier layer, a buffer layer, an active layer, a first gate insulation layer, and the first metal layer sequentially disposed on the substrate base;
a passivation layer, an organic dielectric layer, and the second metal layer sequentially disposed on the first metal layer;
a second gate insulation layer, a first planarization layer, and the third metal layer sequentially disposed on the second metal layer; and
a second planarization layer covering the third metal layer.

11. The array substrate according to claim 10, wherein the first planarization layer is provided with a trench at a position corresponding to the first electrode plate of the storage capacitor, and the second electrode plate of the storage capacitor is formed in the trench.

12. The array substrate according to claim 6, wherein adjacent two columns of the sub-pixels are arranged in a mirror symmetrical structure.

13. The array substrate according to claim 6, wherein adjacent two columns of the sub-pixels share a same reset signal line and at least one first via hole, or share a same power line and at least one second via hole.

14. The array substrate according to claim 6, wherein the reset signal line and the power line extend in a same direction.

15. An OLED display device, wherein the OLED display device comprises an OLED display panel comprising an array substrate, the array substrate comprising a plurality of sub-pixels, each of the sub-pixels comprising a drive thin film transistor and a storage capacitor, and the array substrate further comprising:
   a first metal layer forming a gate electrode and a scan line of the drive thin film transistor;
   a second metal layer forming a source/drain electrode, a data line, a reset signal line of the drive thin film transistor, and a first electrode plate of the storage capacitor; and
   a third metal layer forming a power line and a second electrode plate of the storage capacitor.

16. The OLED display device according to claim 15, wherein one layer of inorganic insulation film and one layer of organic insulation film are provided between the first metal layer and the second metal layer.

17. The OLED display device according to claim 15, wherein one layer of inorganic insulation film and one layer of organic insulation film are provided between the second metal layer and the third metal layer, and only one layer of inorganic insulation film is provided between the first electrode plate and the second electrode plate of the storage capacitor.

18. The OLED display device according to claim 15, wherein the array substrate further comprises:
   a substrate base;
   a barrier layer, a buffer layer, an active layer, a first gate insulation layer, and the first metal layer sequentially disposed on the substrate base;
   a passivation layer, an organic dielectric layer, and the second metal layer sequentially disposed on the first metal layer;
   a second gate insulation layer, a first planarization layer, and the third metal layer sequentially disposed on the second metal layer; and
   a second planarization layer covering the third metal layer.

19. The OLED display device according to claim 18, wherein the first planarization layer is provided with a trench at a position corresponding to the first electrode plate of the storage capacitor, and the second electrode plate of the storage capacitor is formed in the trench.

20. The OLED display device according to claim 18, wherein adjacent two columns of the sub-pixels are arranged in a mirror symmetrical structure.

* * * * *